United States Patent [19]
Nobukata

[11] Patent Number: 5,894,435
[45] Date of Patent: Apr. 13, 1999

[54] NONVOLATILE SEMICONDUCTOR MEMORY DEVICE AND METHOD OF REDUCING READ DISTURBANCE

[75] Inventor: Hiromi Nobukata, Tokyo, Japan

[73] Assignee: Sony Corporation, Japan

[21] Appl. No.: 08/877,639

[22] Filed: Jun. 17, 1997

[30] Foreign Application Priority Data

Jun. 19, 1996 [JP] Japan ................................. 8-158548

[51] Int. Cl.[6] .......................................... G11C 16/00
[52] U.S. Cl. ............................ 365/185.03; 365/185.02; 365/185.17
[58] Field of Search ..................... 365/185.03, 185.02, 365/185.17, 185.18, 185.24, 168

[56] References Cited

U.S. PATENT DOCUMENTS

| | | | |
|---|---|---|---|
| 5,163,021 | 11/1992 | Mehrotra et al. | 365/185.03 |
| 5,424,978 | 6/1995 | Wada et al. | 365/185.03 |
| 5,596,526 | 1/1997 | Assar et al. | 365/185.03 |
| 5,615,151 | 3/1997 | Furuno et al. | 365/185.03 |
| 5,774,397 | 6/1998 | Endoh et al. | 365/185.03 |

*Primary Examiner*—Tan T. Nguyen
*Attorney, Agent, or Firm*—Rader, Fishman & Grauer; Ronald P. Kananen

[57] ABSTRACT

In a nonvolatile semiconductor memory device having a memory array of a NAND structure, threshold voltages of the word line voltage set at the time of reading are set to $V_{WL00}$, $V_{WL01}$, and $V_{WL10}$, and one $V_{WL10}$ among the threshold voltages is set to the negative voltage. By this, it becomes possible to set the threshold voltage distribution width of the memory transistor and the interval between one data and the next wider. As a result, writing control becomes easier and the disturbance/retention characteristics can be enhanced.

4 Claims, 10 Drawing Sheets

FIG. 5

| SELECTION STATE / MODE | SELECTED BLOCK | | NON-SELECTED BLOCK |
|---|---|---|---|
| | SELECTED WORD LINE | NON-SELECTED WORD LINE | NON-SELECTED WORD LINE |
| READ | Vth | 5V | 0V |
| WRITE | 20V | 10V | 0V |
| ERASE | 0V | 0V | 20V |

5V : Vpass
Vth : $V_{WL00}, V_{WL01}, V_{WL10}$

FIG. 6

| READ | SELECTED BLOCK | | UNSELECTED BLOCK | |
|---|---|---|---|---|
| | SELECTED WORD LINE | UNSELECTED WORD LINE | SELECTED WORD LINE | UNSELECTED WORD LINE |
| DSG | 5V | 5V | 0V | 0V |
| BDP | 5V | 5V | 0V | 0V |
| BDN | Vth | Vth | 0V | 0V |
| SSG | 5V | 5V | 0V | 0V |
| NDn | 5V | $V_M$*) | 5V | $V_M$*) |
| WLn | Vth | 5V | 0V | 0V |
| PWL_CTL | 0V | | | |

| WRITE | SELECTED BLOCK | | UNSELECTED BLOCK | |
|---|---|---|---|---|
| | SELECTED WORD LINE | UNSELECTED WORD LINE | SELECTED WORD LINE | UNSELECTED WORD LINE |
| DSG | 10V | 10V | 0V | 0V |
| BDP | 20V | 20V | 0V | 0V |
| BDN | 10V | 10V | 0V | 0V |
| SSG | 0V | 0V | 0V | 0V |
| NDn | 0V | 20V | 0V | 20V |
| WLn | 20V | 10V | 0V | 0V |
| PWL_CTL | 0V | | | |

FIG. 8

| ERASE | SELECTED BLOCK | UNSELECTED BLOCK |
|---|---|---|
| DSG | 0V | 0V |
| BDP | 0V | 20V |
| BDN | 0V | 0V |
| SSG | 0V | 0V |
| NDn | 0V | 0V |
| WLn | 0V | 20V |
| PWL_CTL | 20V | |

FIG. 11

| SELECTION STATE / MODE | SELECTED BLOCK | | NON-SELECTED BLOCK |
|---|---|---|---|
| | SELECTED WORD LINE | NON-SELECTED WORD LINE | NON-SELECTED WORD LINE |
| READ | Vth | $V_M$ | 0V |
| WRITE | −9V | 0V | 0V |
| ERASE | 15V | 15V | 0V |

5V : $V_{WL00}$
Vth : $V_{WL00}, V_{WL01}, V_{WL10}$

FIG. 12

| READ | SELECTED BLOCK | | UNSELECTED BLOCK | |
|---|---|---|---|---|
| | SELECTED WORD LINE | UNSELECTED WORD LINE | SELECTED WORD LINE | UNSELECTED WORD LINE |
| DSG | 5V | 5V | 0V | 0V |
| BDP | Vth | Vth | 0V | 0V |
| BDN | $V_M$*) | $V_M$*) | 0V | 0V |
| NDn | $V_M$*) | 5V | $V_M$*) | 5V |
| WLn | Vth | $V_M$ | 0V | 0V |
| PWL_CTL | 0V | | | |

FIG. 13

| WRITE | SELECTED BLOCK | | UNSELECTED BLOCK | |
|---|---|---|---|---|
| | SELECTED WORD LINE | UNSELECTED WORD LINE | SELECTED WORD LINE | UNSELECTED WORD LINE |
| DSG | 8V | 8V | 0V | 0V |
| BDP | 0V | 0V | 0V | 0V |
| BDN | −9V | −9V | 0V | 0V |
| NDn | 0V | −9V | 0V | −9V |
| WLn | −9V | 0V | 0V | 0V |
| PWL_CTL | 0V | | | |

FIG. 14

| ERASE | SELECTED BLOCK | UNSELECTED BLOCK |
|---|---|---|
| DSG | 0V | 0V |
| BDP | 15V | 0V |
| BDN | 0V | 0V |
| NDn | 0V | 15V |
| WLn | 15V | 0V |
| PWL_CTL | −6V | |

# NONVOLATILE SEMICONDUCTOR MEMORY DEVICE AND METHOD OF REDUCING READ DISTURBANCE

BACKGROUND OF THE INVENTION

1. Field of the Invention

The present invention relates to a nonvolatile semiconductor memory device and method of reducing read disturbance in the same and, more particularly to a multi-valued nonvolatile semiconductor memory device where data of at least three values is recorded in a memory cell.

2. Description of the Related Art

A semiconductor nonvolatile memory device such as an EPROM and flash memory usually adopts a binary type memory cell structure where data taking either of two values of "0" and "1" is recorded in one memory cell transistor.

However, accompanied with the recent demand for increased capacity of nonvolatile semiconductor memory devices, a so-called multi-valued nonvolatile semiconductor memory device where data of three or more values is recorded in one memory cell transistor has been proposed (refer to for example "A Multi-Level 32-Mb Flash Memory", 95 ISSCC p. 132 on).

FIG. 1 is a view of the relationship between a threshold voltage Vth level and data contents (distribution) where data consisting of two bits and taking four values is recorded in one memory transistor in a NAND type flash memory.

In FIG. 1, the ordinate represents the threshold voltage Vth of the memory transistor, and the abscissa represents the frequency of distribution of the threshold values of the memory transistor, respectively.

The content of the 2-bit data comprising the data to be recorded in one memory transistor is represented by [D2, D1]. There are four states, i.e., [D2, D1]=[1, 1], [1, 0], [0, 1], and [0, 0]. Namely, there are four states of the data "0", data "1", data "2", and data "3".

Where there are four values, the distribution of the threshold voltages (distribution of the multi-valued data) becomes three voltages on the positive side and one on the negative side as shown in FIG. 1.

FIG. 2 is a view of the relationship of the threshold voltage Vth level and the data contents (distribution) where data consisting of 2 bits and taking four values is recorded in one memory transistor in a NOR type flash memory.

In FIG. 2, the ordinate represents the threshold voltage Vth of the memory transistor, and the abscissa represents the frequency of distribution of the threshold values of the memory transistor, respectively.

The content of the 2-bit data comprising the data to be recorded in one memory transistor is represented by [D2, D1] similar to the above NAND type. There are also four states, i.e., [D2, D1]=[0, 0], [0, 1], [1, 0], and [1, 1].

In this NOR type, the distribution of the threshold voltages (distribution of the multi-valued data) becomes four voltages on the positive side as shown in FIG. 2.

In a NAND type or DINOR (divided NOR) type flash memory, the rewriting and reading of data are carried out in units of pages.

In the case of a general NAND type flash memory, in order to program memory cell transistors to a first program state (data "2"), a second program state (data "1"), and a third program state (data "0") from an erasing state (data "3"), writing is carried on the cells to have the write data [1, 0], [0, 1], and [0, 0] in a state where the voltage of the word line (gate voltage $V_G$) is set to a constant voltage, for example, $-10V$. More specifically, the writing is carried out by setting, for example, the bit line voltage (drain voltage $V_D$) to 6V (gate voltage $V_G=-10V$) so the threshold voltage Vth is shifted to the distribution "10". At this time, a drain voltage $V_D=0V$ (gate voltage $V_G=-10V$) is added to the cells to have the write data of [1, 1], but since the electric field is insufficient, the threshold Vth does not change (the distribution "11" is maintained).

Next, the writing is carried out with respect to the cells to have the write data of [0, 1] and [0, 0]. Then, finally, the writing is carried out with respect to the cells to have the write data of [0, 0], thereby ending the multi-valued writing. Note that, the writing operation is carried out by the write verify system.

At the time of reading, in the case of a NAND type, for example, the voltage of a selected word line is set to $V_{WL00}$ for the reading, then it is set to $V_{WL01}$ for the reading, and finally it is set to 0V for the reading. In this case, the voltage of the non-selected word lines is set to the positive side $V_{pass}$ (for example 5V).

In the case of a DINOR type, the voltage of the word line which is selected is set to $V_{WL00}$ for the reading, then it is set to $V_{WL01}$ for the reading, and finally it is set to $V_{WL10}$ for the reading. In this case, the voltage of the non-selected word lines is set to 0V.

Then, the number of high level data in the read out data performed three times is counted, and the count (binary number) is defined as the data of On+1 (D2), IOn(D1).

In the case of a NAND type flash memory, the lowest voltage of the word lines at the time of reading is 0V, therefore when realizing a multi-valued structure, it is necessary to allocate $2^n-1$ distribution of threshold in the range from the upper limit of the distribution to 0V.

For this reason, there is a problem in that the width per distributions and the interval between distributions are narrow, so a high precision is required for the writing control and, at the same time, the memory is susceptible to disturbances and is weak in retention.

A more concrete explanation will be made of this problem below.

For example, in the case of four values, as the correspondence of the multi-valued data and the distribution of threshold values, as shown in FIG. 1, the data having a distribution of "10" is decided by 0V by setting the lower limit to 0.4V (for example, refer to 1996 IEEE International Solid-State Circuits Conference, ISSCC96/SESSION 2/FLASH MEMORY/PAPER TP 2.1: A 3.3 V 128 Mb Multi-Level NAND Flash Memory for Mass Storage Applications, pp 32-33).

Further, due to the limitations of a NAND type flash memory, the upper limit of the threshold voltage Vth must be set to considerably lower than the voltage of the non-selected word lines so as to increase the amount of the cell current.

Further, the voltage of the non-selected word lines cannot be set too high due to the restrictions due to reading disturbances.

For this reason, it is necessary to arrange the distribution of three values in a range from 0V to 3.2V, so an extremely high precision control of the threshold voltage Vth becomes necessary. Further, also the disturbances and retention problems become serious.

In the case of a DINOR type flash memory, the distribution of the threshold voltage Vth becomes four voltages on the positive side as shown in FIG. 2. Since the voltage of the non-selected word lines is 0V, there is the problem that the width per distribution and the interval between distributions are narrow, so a high precision is required for the writing control and, at the same time, the memory is susceptible to disturbances and is poor in retention.

SUMMARY OF THE INVENTION

An object of the present invention is to provide a non-volatile semiconductor memory device with which the wide width and a wide interval between distributions of the threshold voltages of the multi-valued data can be obtained, the write control is facilitated, and the disturbance/retention characteristic can be enhanced.

According to a first aspect of the present invention, there is provided a nonvolatile semiconductor memory device comprising a plurality of data storage memory transistors being located at cross points of a plurality of word lines and a plurality of bit lines, each the data storage memory transistor having a charge storing portion, a threshold voltage of the data storage memory transistor being changed in response to an amount of a charge stored in the charge storing portion, and each the data storage memory transistor having multi-level data states comprised of at least three levels according to the change of the threshold voltage; a plurality of NAND strings, each NAND string constituted by a series connection of the data storage memory transistors between a source line and the bit line; a data programming means for changing the threshold voltage of the data storage memory transistor by applying a program word line voltage and a program bit line voltage to the data storage memory transistor in response to a programming data level selected from the multi-level data states; and a data reading means for reading out the programmed data read out by applying a read word line voltage and a read bit line voltage to the data storage memory transistor in response to the programmed data level selected from the multi-level data states, wherein at least read word line voltage is in a range of negative voltage.

Preferably, a lowermost threshold voltage distribution of a first data level and a part of a next lowest threshold voltage distribution of a second data level are in a range of negative voltage.

According to a second aspect of the present invention, there is provided a method of reducing read disturbance of a nonvolatile semiconductor memory device, wherein the nonvolatile semiconductor memory device comprises a plurality of data storage memory transistors being located at cross points of a plurality of word lines and a plurality of bit lines, each data storage memory transistor having a charge storing portion, a threshold voltage of the data storage memory transistor being changed in response to an amount of a charge stored in the charge storing portion, and each the data storage memory transistor having multi-level data states comprised of at least three levels in response to the change of the threshold voltage and a plurality of NAND strings, each the the NAND strings constituted by a series connection of the data storage memory transistors between a source line and the bit line; the method of the nonvolatile semiconductor device comprising the steps of a data programming step by which the threshold voltage of the data storage memory transistor is changed by applying a program word line voltage and a program bit line voltage to the data storage memory transistor in response to a programming data level selected from the multi-level data states and a data reading step by which the programmed data is read out by applying a read word line voltage and a read bit line voltage to the data storage memory transistor in response to the programmed data level selected from the multi-level data states, wherein at least read word line voltage is in a range of negative voltage.

Preferably, again, a lowermost threshold voltage distribution of a first data level and a part of a next lowest threshold voltage distribution of a second data level are in a range of negative voltage.

According to a third aspect of the present invention, there is provided a nonvolatile semiconductor memory device comprising a plurality of data storage memory transistors being located at cross points of a plurality of word lines and a plurality of bit lines, each the data storage memory transistor having a charge storing portion, a threshold voltage of the data storage memory transistor being changed in response to an amount of a charge stored in the charge storing portion, and each data storage memory transistor having multi-level data states comprised of at least three levels according to the change of the threshold voltage; a NOR-type structure, the NOR-type structure constituted of each of the data storage memory transistors connected in parallel between a source line and the bit line; a data programming means for changing the threshold voltage of the data storage memory transistor by applying a program word line voltage and a program bit line voltage to the data storage memory transistor in response to a programming data level selected from the multi-level data states; and a data reading means for reading out the programmed data by applying a read word line voltage and a read bit line voltage to the data storage memory transistor in response to the programmed data level selected from the multi-level data states, wherein at least one read word line voltage is in a range of negative voltage.

Preferably, part of a lowermost threshold voltage distribution of a first data level is in a range of negative voltage.

According to a fourth aspect of the present invention, there is provided a method of reducing read disturbance of a nonvolatile semiconductor memory device, wherein the nonvolatile semiconductor memory device comprises a plurality of data storage memory transistors being located at cross points of a plurality of word lines and a plurality of bit lines, each the data storage memory transistor having a charge storing portion, a threshold voltage of the data storage memory transistor being changed in response to an amount of a charge stored in the charge storing portion, and each the data storage memory transistor having multi-level data states comprised of at least three levels in response to the change of the threshold voltage and a NOR-type structure, the NOR-type structure constituted of each of the data storage memory transistors connected in parallel between a source line and the bit line; the method of the nonvolatile semiconductor device comprising the steps of a data programming step by which the threshold voltage of the data storage memory transistor is changed by applying a program word line voltage and a program bit line voltage to the data storage memory transistor in response to a programming data level selected from the multi-level data states and a data reading step by which the programmed data is read out by applying a read word line voltage and a read bit line voltage to the data storage memory transistor in response to the programmed data level selected from the multi-level data states, wherein at least one read word line voltage is in a range of negative voltage.

Preferably, again part of a lowermost threshold voltage distribution of a first data level is in a range of negative voltage.

According to the present invention, in a nonvolatile semiconductor memory device of NAND structure, at least one of word line voltages to be set at the time of reading is set to a negative voltage. In a nonvolatile semiconductor memory device having a memory array of the NOR structure, the voltage of the non-selected word lines among the word line voltages to be set at the time of reading is set to a negative voltage.

By this, it becomes possible to set the threshold voltage distribution widths of the memory transistor and the interval between one data and the next wider. As a result, the write control becomes easier and the disturbance/retention characteristics is enhanced.

BRIEF DESCRIPTION OF THE DRAWINGS

These and other objects and features of the present invention will become clearer from the following description of the preferred embodiments given with reference to the appended drawings, in which:

FIG. 5 is a view of a biasing condition of principal parts at the time of the reading, writing, and erasing operations in the circuit of FIG. 3;

FIG. 6 is a view of the concrete biasing conditions at the time of a reading operation in the circuit of FIG. 3;

FIG. 7 is a view of the concrete biasing conditions at the time of a writing operation in the circuit of FIG. 3;

FIG. 8 is a view of the concrete biasing conditions at the time of an erasing operation in the circuit of FIG. 3;

FIG. 11 is a view of the biasing conditions of principal parts at the time of reading, writing, and erasing operations in the circuit of FIG. 9;

FIG. 12 is a view of the concrete biasing conditions at the time of a reading operation in the circuit of FIG. 9;

FIG. 13 is a view of the concrete biasing conditions at the time of a writing operation in the circuit of FIG. 9; and FIG. 14 is a view of the concrete biasing conditions at the time of an erasing operation in the circuit of FIG. 9.

DESCRIPTION OF THE PREFERRED EMBODIMENTS

Figure 1:
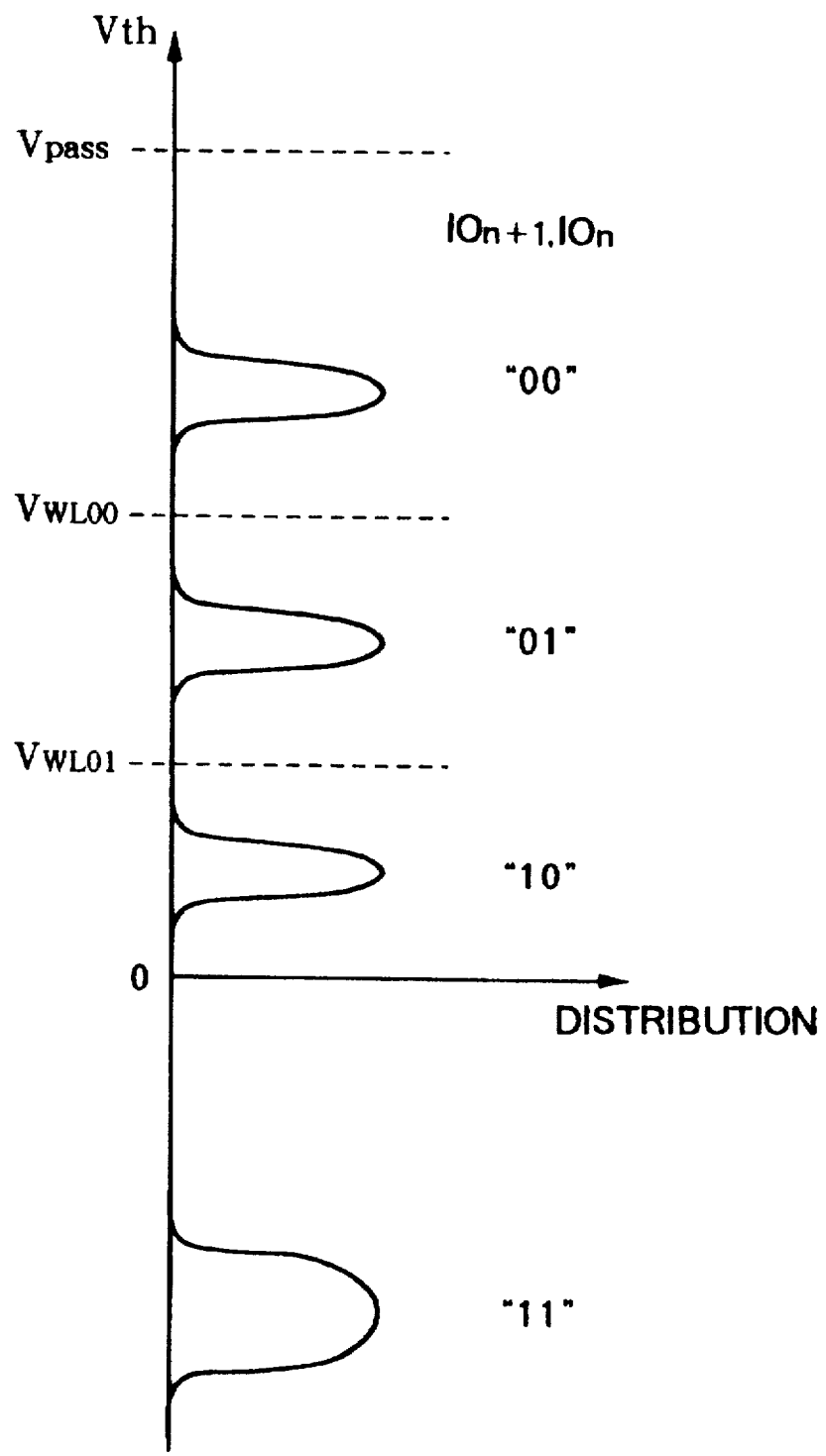
FIG. 1 is a view of a relationship of a threshold voltage Vth level and a distribution of data where data consisting of 2 bits and taking four values is recorded in one memory transistor in a NAND type memory device of the related art.
Figure 2:
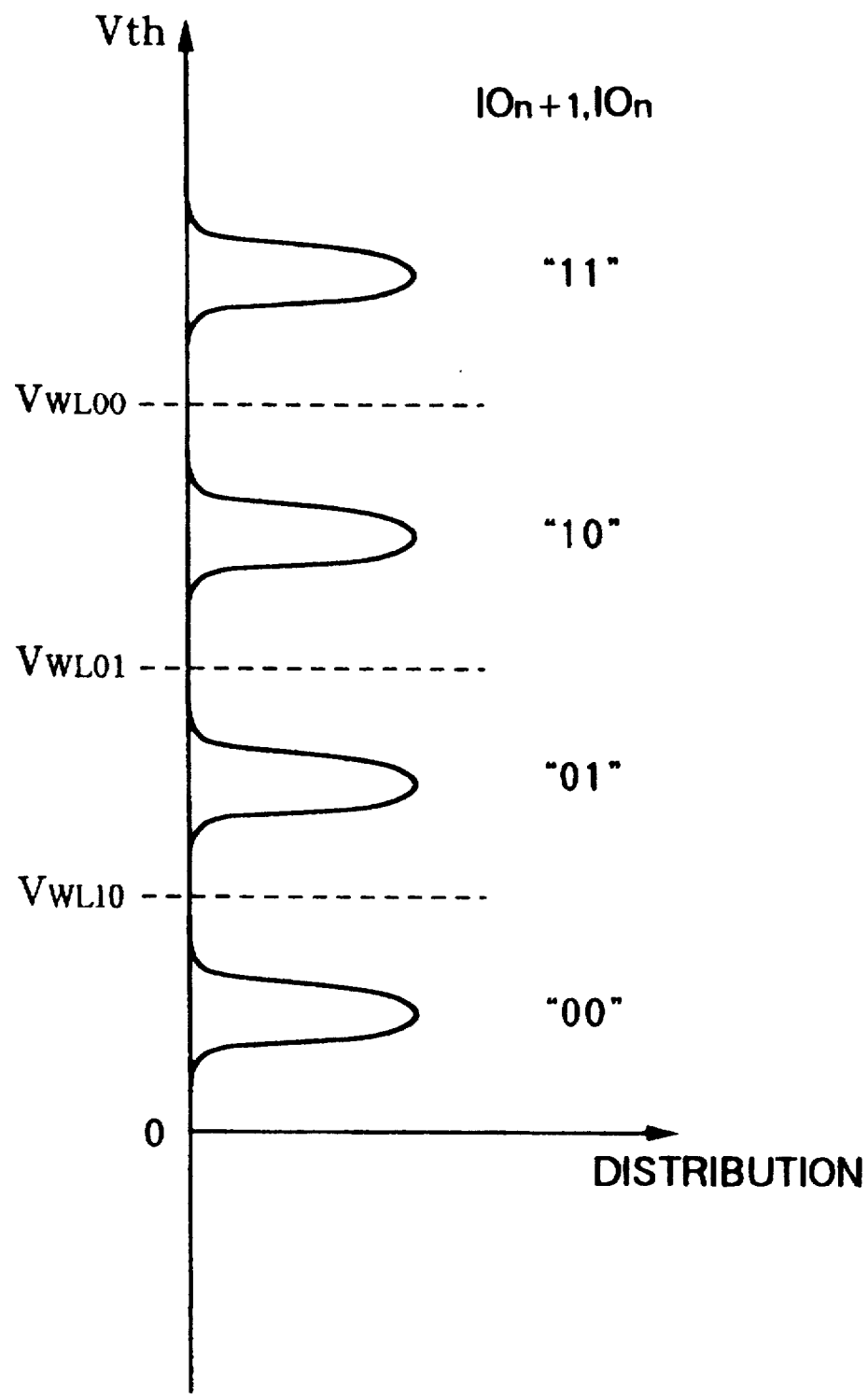
FIG. 2 is a view of the relationship of the threshold voltage Vth level and the distribution of data where data consisting of 2 bits and taking four values is recorded in one memory transistor in a DINOR type memory device of the related art.

Below, a detailed explanation will be made of the embodiments of the present invention by referring to the drawings.

Figure 3:
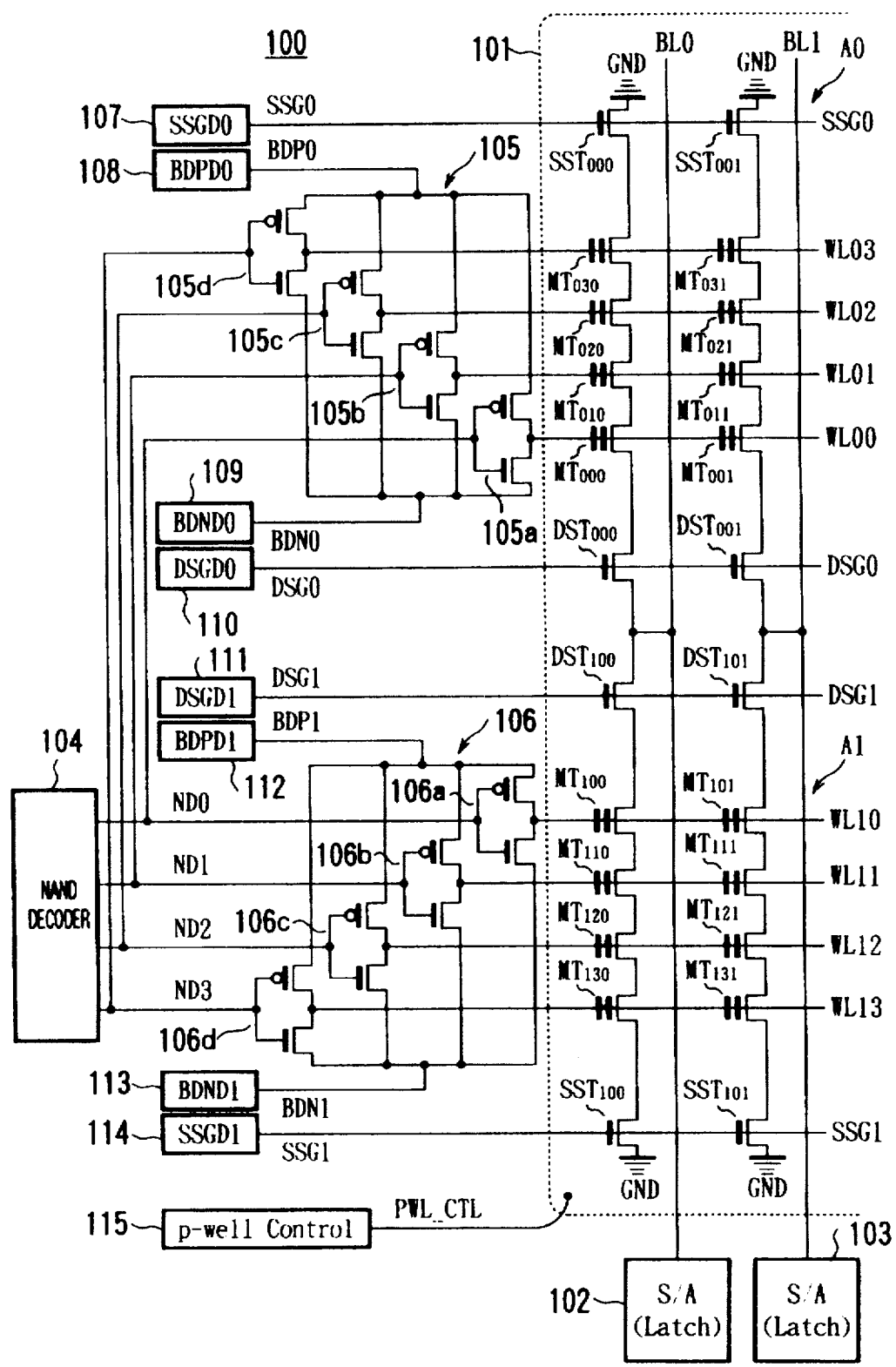
FIG. 3 is a circuit diagram of a first embodiment of a nonvolatile semiconductor memory device according to the present invention.

FIG. 3 is a circuit diagram of a first embodiment of the nonvolatile semiconductor memory device according to the present invention and shows a concrete embodiment of a NAND type flash memory.

This NAND type flash memory 100 is constituted by a memory cell array 101, sense amplifiers 102 and 103, a NAND decoder 104, buffer groups 105 and 106, decoders 107 to 114 and a p-well control circuit 115.

The memory cell array 101 is constituted by two memory cell blocks A0 and A1 each of which have memory cells connected to common word lines.

In the memory cell block A0, two columns of serially connected n-type memory cell transistors MT000 to MT030 and MT001 to MT031 capable of being written with data and erased by the storage and release of charges at, for example, a floating gate are arranged. Gate electrodes of the memory cell transistors of the same rows, i.e. MT000 and MT001, gate electrodes of MT010 and MT011, gate electrodes of MT020 and MT021, and gate electrodes of MT030 and MT031 are connected to the common word lines WL00, WL01, WL02, and WL03, respectively.

The drain of the memory cell transistor MT000 is connected to the bit line BL0 via the selection gate DST000 which is comprised by an n-channel MOS (NMOS) transistor which has a gate electrode which is connected to the selection signal supply line DSG0. The source of the memory cell transistor MT030 is grounded via the source line SL of selection gate SST000 which is comprised by a NMOS transistor which has a gate electrode which is connected to the selection signal supply line SSG0.

The drain of the memory cell transistor MT001 is connected to the bit line BL1 via the selection gate DST001 which is comprised by an NMOS transistor which has a gate electrode which is connected to the selection signal supply line DSG0. The source of the memory cell transistor MT031 is grounded via the selection gate SST001 which is comprised by an NMOS transistor which has a gate electrode which is connected to the selection signal supply line SSG0.

In the memory cell block A1, two columns of serially connected n-type memory cell transistors MT100 to MT130 and MT101 to MT131 capable of being written with data and erased by the storage and release of charges at, for example, a floating gate are arranged. Gate electrodes of the memory cell transistors of the same rows, i.e., MT100 and MT101, gate electrodes of MT110 and MT111, gate electrodes of MT120 and MT121, and gate electrodes of MT130 and MT131 are connected to the common word lines WL10, WL11, WL12, and WL13, respectively.

The drain of the memory cell transistor MT100 is connected to the bit line BL0 via the selection gate DST100 which is comprised by an NMOS transistor which has a gate electrode connected to the selection signal supply line DSG1. The source of the memory cell transistor MT130 is grounded via the selection gate SST100 which is comprised of an NMOS transistor which has a gate electrode connected to the selection signal supply line SSG1.

The drain of the memory cell transistor MT101 is connected to the bit line BL1 via the selection gate DST101 which is comprised of an NMOS transistor which has a gate electrode which is connected to the selection signal supply line DSG1. The source of the memory cell transistor MT131 is grounded via the selection gate SST101 which is comprised of an NMOS transistor which has a gate electrode which is connected to the selection signal supply line SSG1.

The memory cell transistors MT000 to MT030, MT001 to MT031, MT100 to MT130, and MT101 to MT131 and the selection gates DST000, DST001, SST000, SST001, DST100, DST101, SST100, and SST101 of the memory cell blocks A0 and A1 are formed in a p-well. This p-well is connected to a p-well control circuit 115.

n number of bits of multi-valued data are stored in the memory cell transistors MT000 to MT030, MT001 to MT031, MT100 to MT130, and MT101 to MT131.

In the present embodiment, multi-valued data consisting of 2 bits and taking four values is stored.

Figure 4:
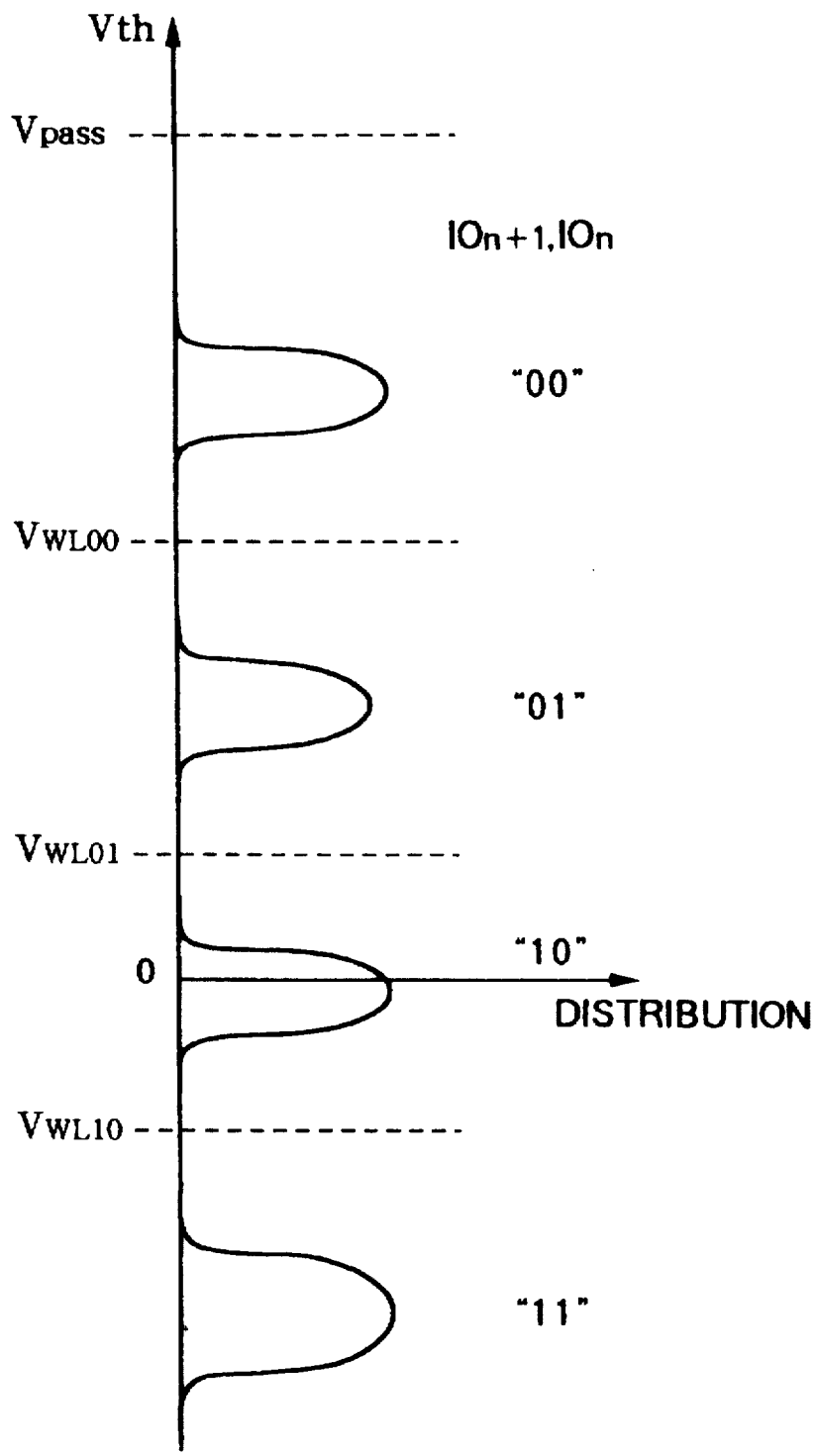
FIG. 4 is a view of the relationship of the threshold voltage Vth level and the distribution of data where data consisting of 2 bits and taking four values is recorded in one memory transistor in a NAND type flash memory according to the present invention.

FIG. 4 is a view of the relationship of the threshold voltage Vth level and the data content where data consisting of 2 bits and taking four values is recorded in one memory transistor in a NAND type flash memory according to the present invention.

In FIG. 4, the ordinate represents the threshold voltage Vth of the memory transistor, and the abscissa represents the frequency of distribution of the threshold values of the memory transistor, respectively.

The content of the 2-bit data comprising the data to be recorded in one memory transistor is represented by |D2, D1|. There are four states, i.e., [D2, D1]=[1, 1], [1, 0], [0, 1], and [0, 0]. Namely, there are four states of the data "0", data "1", data "2" and data "3".

Where there are four values, the distribution of the threshold voltage Vth (distribution of the multi-valued data) becomes two voltages on the positive side and two on the negative side as shown in FIG. 4. Note, the distribution "10" becomes spread over the positive side and the negative side while straddling 0V (one part exists on the negative side).

A sense amplifier 102 is constituted by latch type and is connected to the bit line BL0.

Similarly, a sense amplifier 103 is constituted by latch type and is connected to the bit line BL1.

A NAND decoder 104 has four output nodes ND0 to ND3 connected to the word lines WL0 to WL03 and WL10 to WL13 via inversion circuits 105 and 106 and sets output voltages from the nodes NDn (n=0, 1, 2, 3) so that the selected and non-selected word line voltages are set as shown in FIG. 5 in accordance with the reading, writing, and erasing operation modes.

As shown in FIG. 5, as the word line voltages at the time of reading, the selected word line voltage is set to Vth ($V_{WL00}$, $V_{WL01}$, and $V_{WL10}$), the voltage of the non-selected word lines of the selected memory cell block A0 or A1 are set to 5V, and the voltage of all word lines of the non-selected block (non-selected word lines) is set to 0V.

As the word line voltages at the time of writing, the voltage of the selected word line is set to 20V, the voltage of the non-selected word lines of the selected memory cell block A0 or A1 is set to 10V, and the voltage of all word lines of the non-selected block (non-selected word lines) is set to 0 V.

As the word line voltage at the erasing, the voltage of the selected word line is set to 0 V, the voltage of the non-selected word lines of the selected memory cell block A0 or A1 is set to 0 V, and the voltage of all word lines of the non-selected block (non-selected word lines) is set to 20V.

At this time, the p-well of the memory array is charged to 20V by the p-well control circuit 115.

Then, as the voltage of the nodes NDn at the time of reading, as shown in FIG. 6, the node voltage connected to the selected word line is set to 5V, the voltage of the non-selected word lines of the selected memory cell block A0 or A1 is set to $V_M$ ($V_{WL10}$), the voltage of the node connected to the selected word line of the non-selected block is set to 5V, and the voltage of the nodes connected to the non-selected word lines is set to $V_M$.

As the voltage of the nodes NDn at the time of writing, as shown in FIG. 7, the node voltage connected to the selected word line is set to 0V, the voltage of the non-selected word lines of the selected memory cell block A0 or A1 is set to 20V, the voltage of the node connected to the selected word line of the non-selected block is set to 0V, and the voltage of the nodes connected to the non-selected word lines is set to 20V.

As the voltage of the nodes NDn at the time of erasing, as shown in FIG. 8, the node voltage connected to the selected word line voltage is set to 20V, and the node voltage to the non-selected block side is set to 0V.

The inversion circuit group 105 is constituted by inversion circuits 105a, 105b, 105c, and 105d comprising a CMOS inverter.

An input terminal of the inversion circuit 105a (gates of the NMOS transistor and the PMOS transistor) is connected to the output node ND0 of the NAND decoder 104, and an output terminal (connection point of drains of the NMOS transistor and the PMOS transistor) is connected to the word line WL00.

The input terminal of the inversion circuit 105b (gates of the NMOS transistor and the PMOS transistor) is connected to the output node ND1 of the NAND decoder 104, and an output terminal (connection point of drains of the NNOS transistor and the PMOS transistor) is connected to the word line WL01.

The input terminal of the inversion circuit 105c (gates of the NMOS transistor and the PMOS transistor) is connected to the output node ND2 of the NAND decoder 104, and an output terminal (connection point of drains of the NMOS transistor and the PMOS transistor) is connected to the word line WL02.

The input terminal of the inversion circuit 105d (gates of the NMOS transistor and the PMOS transistor) is connected to the output node ND3 of the NAND decoder 104, and an output terminal (connection point of drains of the NMOS transistor and the PMOS transistor) is connected to the word line WL03.

The sources of the PMOS transistors constituting the inversion circuits 105a to 105d are commonly connected to the output signal line BDP0 of the decoder 108, and the sources of the NMOS transistors are commonly connected to the output signal line BDN0 of the decoder 109.

An inversion circuit group 106 is constituted by inversion circuits 106a, 106b, 106c, and 106d comprising a CMOS inverter.

The input terminal of the inversion circuit 106a (gates of the NMOS transistor and the PMOS transistor) is connected to the output node ND0 of the NAND decoder 104, and the output terminal (connection point of drains of the NMOS transistor and the PMOS transistor) is connected to the word line WL10.

The input terminal of the inversion circuit 106b (gates of the NMOS transistor and the PMOS transistor) is connected to the output node ND1 of the NAND decoder 104, and the output terminal (connection point of drains of the NMOS transistor and the PMOS transistor) is connected to the word line WL11.

The input terminal of the inversion circuit 106c (gates of the NMOS transistor and the PMOS transistor) is connected to the output node ND2 of the NAND decoder 104, and the output terminal (connection point of drains of the NMOS transistor and the PMOS transistor) is connected to the word line WL12.

The input terminal of the inversion circuit 106d (gates of the NMOS transistor and the PMOS transistor) is connected to the output node ND3 of the NAND decoder 104, and the output terminal (connection point of drains of the NMOS transistor and the PMOS transistor) is connected to the word line WL13.

The sources of the PMOS transistors constituting the inversion circuits 106a to 106d are commonly connected to the output signal line BDP1 of the decoder 112, and the sources of the NMOS transistors are commonly connected to the output signal line BDN1 of the decoder 113.

The decoder (SSGD0) 107 sets the selection signal supply line SSG0 to the predetermined potential in accordance with the reading, writing, and erasing operation modes.

More specifically, at the time of reading, it is set to 5V when the block A0 is selected, while it is set to 0V when the block A0 is not selected.

At the time of writing and erasing, it is set to 0V regardless of whether the block A0 is selected or not.

The decoder (BDPD0) 108 sets the signal line BDP0 connected to the inversion circuit 105 to the predetermined potential in accordance with the reading, writing, and erasing operation modes.

More specifically, at the time of reading, it is set to 5V when the block A0 is selected, while it is set to 0V when the block A0 is not selected.

At the time of writing, it is set to 20V when the block A0 is selected, while it is set to 0V when the block A0 is not selected.

At the time of erasing, it is set to 0V when the block A0 is selected, while it is set to 20V when the block A0 is not selected.

The decoder (BDND0) 109 sets the signal line BDN0 connected to the inversion circuit 105 to the predetermined potential in accordance with the reading, writing, and erasing operation modes.

More specifically, at the time of reading, it is set to Vth ($V_{WL00}$, $V_{WL01}$, and $V_{WL10}$) when the block A0 is selected, while it is set to 0V when the block A0 is not selected.

At the time of writing, it is set to 10V when the block A0 is selected, while it is set to 0V when the block A0 is not selected.

At the time of erasing, it is set to 0V regardless of whether the block A0 is selected or not.

The decoder (DSGD0) 110 sets the selection signal supply line DSG0 to the predetermined potential in accordance with the reading, writing, and erasing operation modes.

More specifically, at the time of reading, it is set to 5V when the block A0 is selected, while it is set to 0V when the block A is not selected.

At the time of writing, it is set to 10V when the block A0 is selected, while it is set to 0V when the block A0 is not selected.

At the time of erasing, it is set to 0V regardless of whether the block A0 is selected or not.

The decoder (DSGD1) 111 sets the selection signal supply line DSG1 to the predetermined potential in accordance with the reading, writing, and erasing operation modes.

More specifically, at the time of reading, it is set to 5V when the block A1 is selected, while it is set to 0V when the block A1 is not selected.

At the time of writing, it is set to 10V when the block A1 is selected, while it is set to 0V when the block A1 is not selected.

At the time of erasing, it is set to 0V regardless of whether the block A1 is selected or not.

The decoder (BDPD1) 112 sets the signal line BDP1 connected to the inversion circuit 106 to the predetermined potential in accordance with the reading, writing, and erasing operation modes.

More specifically, at the time of reading, it is set to 5V when the block A1 is selected, while it is set to 0V when the block A1 is not selected.

At the time of writing, it is set to 20V when the block A1 is selected, while it is set to 0V when the block A1 is not selected.

At the time of erasing, it is set to 0V when the block A1 is selected, while it is set to 20V when the block A1 is not selected.

The decoder (BDND1) 113 sets the signal line BDN1 connected to the inversion circuit 106 to the predetermined potential in accordance with the reading, writing, and erasing operation modes.

More specifically, at the time of reading, it is set to Vth ($V_{WL00}$, $V_{WL01}$, and $V_{WL10}$) when the block A1 is selected, while it is set to 0V when the block A1 is not selected.

At the time of writing, it is set to 10V when the block A1 is selected, while it is set to 0V when the block A1 is not selected.

At the time of erasing, it is set to 0V regardless of whether the block A1 is selected or not.

The decoder (SSGD1) 114 sets the selection signal supply line SSG1 to the predetermined potential in accordance with the reading, writing, and erasing operation modes.

More specifically, at the time of reading, it is set to 5V when the block A1 is selected, while it is set to 0V when the block A1 is not selected.

At the time of writing, it is set to 0V regardless of whether the block A1 is selected or not.

The p-well control circuit 115 sets the potential of the substrate p-well of the memory cell array 101 to the predetermined potential in accordance with the reading, writing, and erasing operation modes.

More specifically, it sets the same to 0V at the time of reading and writing and sets the same to 20V at the time of erasing.

Next, an explanation will be made of the operation by the above configuration.

First, an explanation will be made taking as an example a case where the data stored in the memory cell transistor MT100 belonging to the memory cell block A1 is read.

In this case, the selection signal supply lines SSG0 and DSG0 are set to 0V by the decoders 107 and 110, and the selection signal supply lines DSG1 and SSG1 are set to 5V by the decoders 111 and 114. By this, the selection gates SST000, SST001, DST000, and DST001 of the memory cell block A0 are held in the nonconductive state, and the selection gates DST100, DST101, SST100 and SST101 of the memory cell block A1 are held in the conductive state.

Further, the level of the node ND1 connected to the inversion circuit 106b to which the word line WL11 selected is connected among the four output nodes of the NAND decoder 104 is set to 5V, and the level of the remaining nodes ND0, ND2, and ND3 is set to $V_M$, that is the negative word line voltage $V_{WL10}$ of the lowest value shown in FIG. 4.

Then, at this time, 5V is supplied to the signal line BDP1 by the decoder 112, and Vth in accordance with the threshold voltage of the recording data is supplied to the signal line BDN1 by the decoder 113, more specifically, the corresponding voltage among the word line voltages $V_{WL00}$, $V_{WL01}$, and $V_{WL10}$ shown in FIG. 4 is supplied.

Further, the potential of the p-well of the memory cell array 101 is set to 0V by the p-well control circuit 115.

At this time, 5V is supplied to only the input of the inversion circuit 106b of the inversion circuit group 106, and the negative voltage $V_{WL10}$ is supplied to the inputs of the other inversion circuits 106a, 106c, and 106d, therefore the NMOS transistor side becomes conductive in state only in the inversion circuit 106b, and the PMOS transistor side becomes conductive in state in the other inversion circuits 106a, 106c and 106d.

As a result, the threshold voltage Vth by the decoder 113 is supplied to the selected word line WL11 of the memory cell block A1, and 5V by the decoder 112 is supplied to the other word lines WL10, WL12, and WL13 in the memory cell block A1.

By this, the data stored in the memory cell M110 is read to the bit line BL0 via the selection gates DST100 and amplified at the sense amplifier 102.

Next, an explanation will be made of the case where the data is written in a memory cell transistors connected to the word line WL11 in units of pages.

In this case, the selection signal supply lines SSG0 and DSG0 are set to 0V by the decoders 107 and 110, the selection signal supply line DSG1 is set to 10V by the decoder 111, and the selection signal supply line SSG1 is set to 0V by the decoder 114. By this, the selection gates SST000, SST001, DST000, and DST001 of the memory cell block A0 and the selection gates SST100 and SST101 of the memory cell block A1 are held in the nonconductive state, and the selection gates DST100 and DST101 of the memory cell block A1 are held in the conductive state.

Further, the level of the node ND1 connected to the inversion circuit 106b to which the word line WL11 selected is connected among the four output nodes of the NAND decoder 104 is set to 0V, and the level of the remaining nodes ND0, ND2, and ND3 is set to 20V.

Then, at this time, 20V is supplied to the signal line BDP1 by the decoder 112, and 10V is supplied to the signal line BDN1 by the decoder 113.

Further, the potential of the p-well of the memory cell array 101 is set to 0V by the p-well control circuit 115.

At this time, 0V is supplied to only the input of the inversion circuit 106b of the inversion circuit group 106, and 20V is supplied to the inputs of the other inversion circuits 106a, 106c, and 106d, therefore the PMOS transistor side becomes conductive in state only in the inversion circuit 106b, and the NMOS transistor side becomes conductive in state in the other inversion circuits 106a, 106c, and 106d.

As a result, 20V due to the decoder 112 is supplied to the selected word line WL11 of the memory cell block A1, and 10V due to the decoder 113 is supplied to the other word lines WL10, WL12, and WL13 in the memory cell block A1.

In this state, the write data propagated to the bit line is written in the memory cell transistor as the predetermined potential.

Next, an explanation will be made of the case where the data recorded in a memory cell transistor of the memory cell block A1 is erased.

In this case, the selection signal supply lines SSG0 and DSG0 are set to 0V by the decoders 107 and 110, and the selection signal supply lines DSG1 and SSG1 are set to 0V by the decoders 111 and 114. By this, all selection gates SST000, SST001, DST000, and DST001 and DST100, DST101, SST100, and SST101 of the blocks A0 and A1 are held in the nonconductive state.

Further, the level of the four output nodes ND0, ND1, ND2, and ND3 of the NAND decoder 104 is set to 0V.

Then, at this time, 0V is supplied to the signal line BDP1 by the decoder 112, and 0V is supplied to the signal line BDN1 by the decoder 113. Similarly, 20V is supplied to the signal line BDP0 by the decoder 108, and 0V is supplied to the signal line BDN0 by the decoder 109.

Further, the potential of the p-well of the memory cell array 101 is set to 20V by the p-well control circuit 115.

At this time, 0V is supplied to the inputs of the all inversion circuits 106a to 106d of the inversion circuit group 106, therefore the PMOS transistor side becomes conductive in state in the inversion circuits 106a to 106d. Further, 0V is supplied to the inputs of all inversion circuits 105a to 105d of the inversion circuit group 105, and therefore the PMOS transistor side becomes conductive in state in the inversion circuits 105a to 105d.

As a result, 0V due to the decoder 112 is supplied to the word lines WL10 to WL13 of the memory cell block A1, and 20V due to the decoder 108 is supplied to the word lines WL00 to WL03 of the memory cell block A0.

By this, the data of the memory cell block A1 is erased all together.

As explained above, according to the present embodiment, in the nonvolatile semiconductor memory device 100 having a memory array of the NAND structure, $V_{WL10}$ among the word line voltages $V_{WL00}$, $V_{WL01}$, and $V_{WL10}$ to be set at the time of reading is set to the negative voltage, therefore it becomes possible to set the threshold voltage distribution width of the memory cell transistor and the interval between one data and the next wider. As a result, the writing control becomes easier and the disturbance/retention characteristics can be enhanced.

Figure 9:
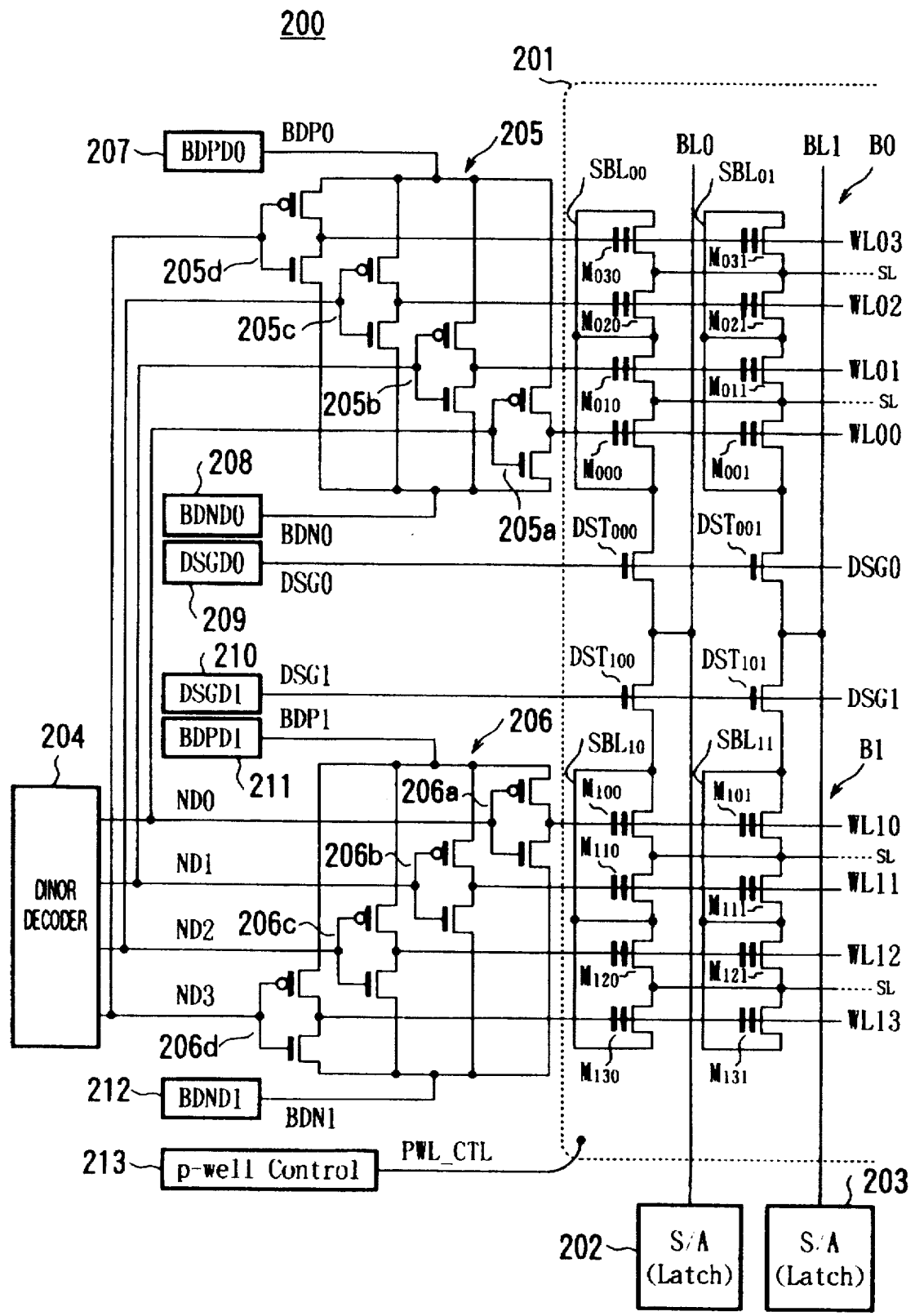
FIG. 9 is a circuit diagram of a second embodiment of the nonvolatile semiconductor memory device according to the present invention.

FIG. 9 is a circuit diagram of a second embodiment of the nonvolatile semiconductor memory device according to the present invention and shows a concrete embodiment of a DINOR type flash memory.

This DINOR type flash memory 200 is constituted by a memory cell array 201, sense amplifiers 202 and 203, a DINOR decoder 204, inversion circuit groups 205 and 206, decoders 207 to 212, and a p-well control circuit 213.

The memory cell array 201 is constituted by two memory cell blocks B0 and B1 each of which has memory cells connected to common word lines.

In the memory cell block B0, two columns of n-type memory cell transistors M000 to M030 and M001 to M031, which are connected in parallel to the sub-bit lines SBL00 and SBL01 and a source line SL, capable of being written with data and erased by the storage and release of charges at for example a floating gate are arranged. Gate electrodes of the memory cell transistors of the same rows, i.e., M000 and M001, gate electrodes of M010 and M011, gate electrodes of M020 and M021, and gate electrodes of M030 and M031 are connected to the common word lines WL00, WL01, WL02, and WL03, respectively.

The drain of the memory cell transistor M000 is connected to the bit line BL0 via the selection gate DST000 comprised by an NMOS transistor which has a gate electrode which is connected to the selection signal supply line DSG0.

The drain of the memory cell transistor M001 is connected to the bit line BL1 via the selection gate DST001 comprised by an NMOS transistor which has a gate electrode which is connected to the selection signal supply line DSG0.

In the memory cell block B1, two columns of n-type memory cell transistors M100 to M130 and M101 to M131, which are connected in parallel to the sub-bit lines SBL10 and SBL11 and the source line SL, capable of being written with data and erased by the storage and release of charges at for example a floating gate are arranged. Gate electrodes of the memory cell transistors of the same rows, i.e., M100 and M101, gate electrodes of M110 and M111, gate electrodes of M120 and M121, and gate electrodes of M130 and M131 are connected to the common word lines WL10, WL11, WL12, and WL13, respectively.

The drain of the memory cell transistor M100 is connected to the bit line BL0 via the selection gate DST100 comprised by an NMOS transistor which has a gate electrode which is connected to the selection signal supply line DSG1.

The drain of the memory cell transistor M101 is connected to the bit line BL1 via the selection gate DST101 comprised of an NMOS transistor which has a gate electrode which is connected to the selection signal supply line DSG1.

The memory cell transistors M000 to M030, M001 to M031, M100 to M130, and M101 to M131 and the selection gates DST000, DST001, DST100, and DST11 of the memory cell blocks B0 and B1 are formed in a p-well. This p-well is connected to a p-well control circuit 213.

n number of bits of multi-valued data are stored in the memory cell transistors M000 to M030, M001 to M031, M100 to M130, and M101 to M131.

In the present embodiment, multi-valued data consisting of 2 bits and taking four values is stored.

Figure 10:
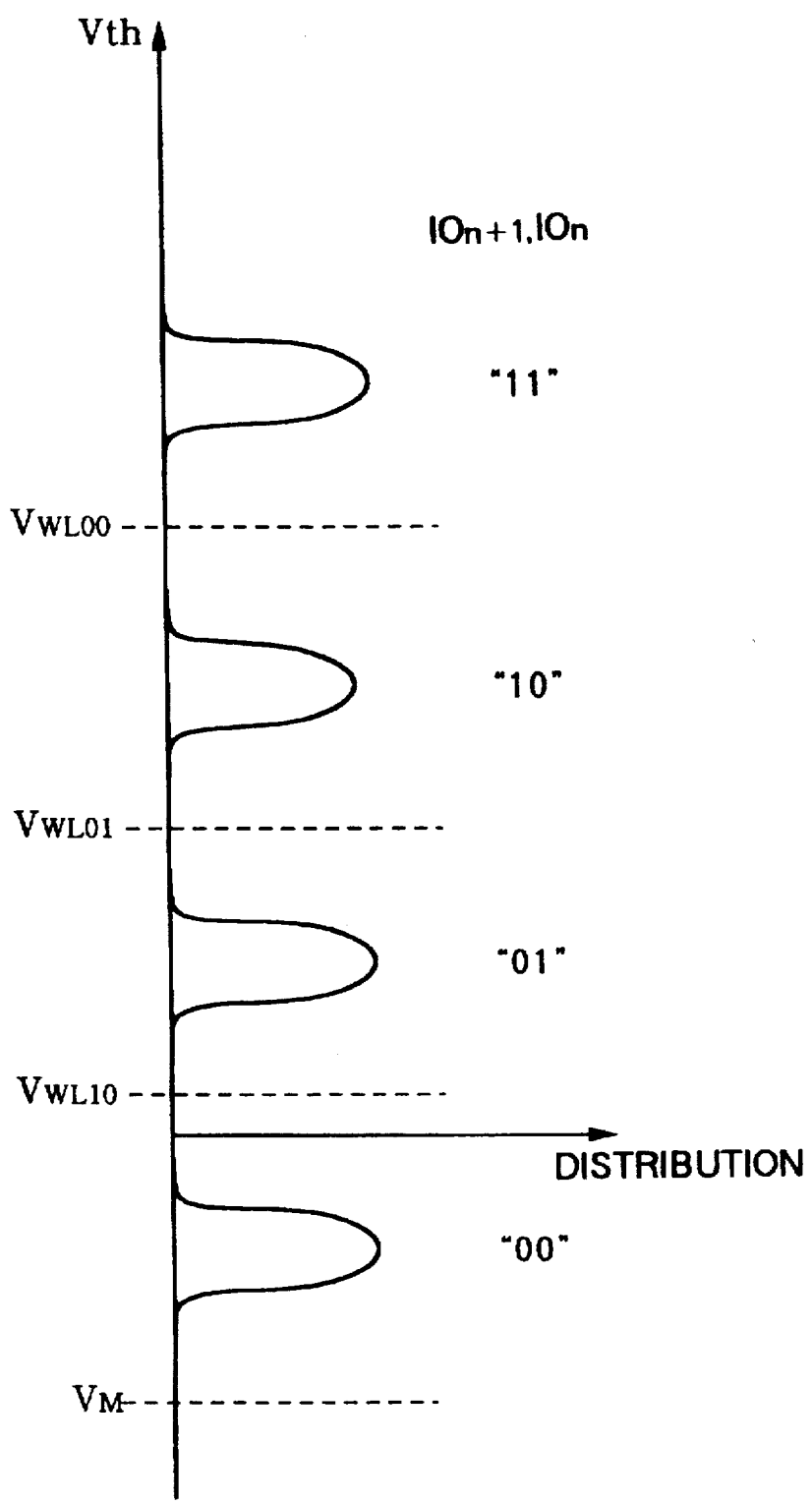
FIG. 10 is a view of the relationship of the threshold voltage Vth level and the distribution of data where data consisting of 2 bits and taking four values is recorded in one memory transistor in a DINOR type flash memory according to the present invention.

FIG. 10 is a view of the relationship of the threshold voltage Vth level and the data content (distribution) when data consisting of 2 bits and taking four values is recorded in one memory transistor in the DINOR type flash memory according to the present invention.

In FIG. 10, the ordinate represents the threshold voltage Vth of the memory transistor, and the abscissa represents the frequency of distribution of the threshold value of the memory transistor, respectively.

The content of the 2-bit data comprising the data to be recorded in one memory transistor is represented by [D2, D1]. There are four states, i.e., [D2, D1]=[1, 1], [1, 0], [0, 1], and [0, 0]. Namely, there are four states of the data "0", data "1", data "2", and data "3".

Where there are four values, the distribution of the threshold voltage Vth (distribution of the multi-valued data) becomes three voltages on the positive side and one on the negative side as shown in FIG. 10. Then, a negative voltage $V_M$ is given as the non-selected word line voltage.

Sense amplifiers 202 and 203 are constituted by latch types and are connected to the bit lines BL0 and BL1, respectively.

A DINOR decoder 204 has four output nodes ND0 to ND3 connected to the word lines WL0 to WL03 and WL10 to WL13 via inversion circuits 205 and 206 and sets output voltages from the nodes NDn (n=0, 1, 2, 3) so that the selected and non-selected word line voltages are set as shown in FIG. 11 in accordance with the reading, writing, and erasing operation modes.

As shown in FIG. 11, as the word line voltage at the time of reading, the selected word line voltage is set to Vth ($V_{WL00}$, $V_{WL01}$, and $V_{WL10}$), the voltage of the non-selected word lines of the selected memory cell block B0 or B1 is set to the negative voltage $V_M$, and the voltage of all word lines of the non-selected block (non-selected word lines) is set to 0V.

As the word line voltage at the time of writing, the voltage of the selected word line is set to −9V, and the voltage of the non-selected word lines of the selected and non-selected memory cell blocks B0 and B1 is set to 0V.

As the word line voltage at the time of erasing, the voltage of the selected and non-selected word lines of the selected block between the selected and non-selected memory cell blocks B0 and B1 is set to 15V, and the voltage of all word lines of the non-selected block (non-selected word lines) is set to 0V.

At this time, the p-well of the memory array is charged to 20V by the p-well control circuit 115.

As the voltage of the nodes NDn at the time of reading, as shown in FIG. 12, the node voltage connected to the selected word line voltage is set to $V_M$, the voltage of the non-selected word lines of the selected memory cell block B0 or B1 is set to 5V, the voltage of the node connected to the selected word line of the non-selected block is set to $V_M$, and the voltage of the nodes connected to the non-selected word line is set to 5V.

As the voltage of the nodes NDn at the time of writing, as shown in FIG. 13, the node voltage connected to the selected word line voltage is set to 0V, the node voltage connected to the non-selected word lines of the selected memory cell block B0 or B1 is set to −9V, the node voltage connected to the selected word line of the non-selected block is set to 0V, and the node voltage connected to the non-selected word lines of the non-selected block is set to −9V.

As the voltage of the nodes NDn at the time of erasing, as shown in FIG. 14, the node voltage connected to the selected word line voltage is set to 0V, and the node voltage to the non-selected block side is set to 15V.

The inversion circuit group 205 is constituted by inversion circuits 205a, 205b, 205c, and 205d comprising a CMOS inverter.

The input terminal of the inversion circuit 205a (gates of the NMOS transistor and the PMOS transistor) is connected to the output node ND0 of the DINOR decoder 204, and an output terminal (connection point of drains of the NMOS transistor and the PMOS transistor) is connected to the word line WL00.

The input terminal of the inversion circuit 205b (gates of the NMOS transistor and the PMOS transistor) is connected to the output node ND1 of the DINOR decoder 204, and an output terminal (connection point of drains of the NMOS transistor and the PMOS transistor) is connected to the word line WL01.

The input terminal of the inversion circuit 205c (gates of the NMOS transistor and the PMOS transistor) is connected to the output node ND2 of the DINOR decoder 204, and an output terminal (connection point of drains of the NMOS transistor and the PMOS transistor) is connected to the word line WL02.

The input terminal of the inversion circuit 205d (gates of the NMOS transistor and the PMOS transistor) is connected to the output node ND3 of the DINOR decoder 204, and an output terminal (connection point of drains of the NMOS transistor and the PMOS transistor) is connected to the word line WL03.

Then, the sources of the PMOS transistors constituting the inversion circuits 205a to 205d are commonly connected to the output signal line BDP0 of the decoder 207, and the sources of the NMOS transistors are commonly connected to the output signal line BDN0 of the decoder 208.

An inversion circuit group 206 is constituted by inversion circuits 206a, 206b, 206c, and 206d comprising a CMOS inverter.

The input terminal of the inversion circuit 206a (gates of the NMOS transistor and the PMOS transistor) is connected to the output node ND0 of the DINOR decoder 204, and the output terminal (connection point of drains of the NMOS transistor and the PMOS transistor) is connected to the word line WL10.

The input terminal of the inversion circuit 206b (gates of the NMOS transistor and the PMOS transistor) is connected to the output node ND1 of the DINOR decoder 204, and the output terminal (connection point of drains of the NMOS transistor and the PMOS transistor) is connected to the word line WL11.

The input terminal of the inversion circuit 206c (gates of the NMOS transistor and the PMOS transistor) is connected to the output node ND2 of the DINOR decoder 204, and the output terminal (connection point of drains of the NMOS transistor and the PMOS transistor) is connected to the word line WL12.

The input terminal of the inversion circuit 206d (gates of the NMOS transistor and the PMOS transistor) is connected to the output node ND3 of the DINOR decoder 204, and the output terminal (connection point of drains of the NMOS transistor and the PMOS transistor) is connected to the word line WL13.

The sources of the PMOS transistors constituting the inversion circuits 206a to 206d are commonly connected to the output signal line BDP1 of the decoder 211, and the sources of the NMOS transistors are commonly connected to the output signal line BDN1 of the decoder 212.

The decoder (BDPD0) 207 sets the signal line BDP0 connected to the inversion circuit 205 to the predetermined potential in accordance with the reading, writing, and erasing operation modes.

More specifically, at the time of reading, it is set to Vth ($V_{WL00}$, $V_{WL01}$, and $V_{WL10}$) where the block B0 is selected, while it is set to 0V when the block B0 is not selected.

At the time of writing, it is set to 0V regardless of whether the block A0 is selected or not.

At the time of erasing, it is set to 15V when the block A0 is selected, and set to 0V when the block A0 is not selected.

The decoder (BDND0) 208 sets the signal line BDN0 connected to the inversion circuit 205 to the predetermined potential in accordance with the reading, writing, and erasing operation modes.

More specifically, at the time of reading, it is set to $V_M$ where the block A0 is selected, while it is set to 0V when the block A0 is not selected.

At the time of writing, it is set to −9V when the block A0 is selected, while it is set to 0V when the block A0 is not selected.

At the time of erasing, it is set to 0V regardless of whether the block A0 is selected or not.

The decoder (DSGD0) 209 sets the selection signal supply line DSG0 to the predetermined potential in accordance with the reading, writing, and erasing operation modes.

More specifically, at the time of reading, it is set to 5V when the block A0 is selected, while it is set to 0V when the block A0 is not selected.

At the time of writing, it is set to 8V when the block A0 is selected, while it is set to 0V when the block A0 is not selected.

At the time of erasing, it is set to 0V regardless of whether the block A0 is selected or not.

The decoder (DSGD1) 210 sets the selection signal supply line DSG1 to the predetermined potential in accordance with the reading, writing, and erasing operation modes.

More specifically, at the time of reading, it is set to 5V when the block A1 is selected, while it is set to 0V when the block A1 is not selected.

At the time of writing, it is set to 8V when the block A1 is selected, while it is set to 0V when the block A1 is not selected.

At the time of erasing, it is set to 0V regardless of whether the block A1 is selected or not.

The decoder (BDPD1) 211 sets the signal line BDP1 connected to the inversion circuit 206 to the predetermined potential in accordance with the reading, writing, and erasing operation modes.

More specifically, at the time of reading, it is set to Vth ($V_{WL00}$, $V_{WL01}$ and $V_{WL10}$) where the block A1 is selected, while it is set to 0V when the block A1 is not selected.

At the time of writing, it is set to 0V regardless of whether the block A1 is selected or not.

At the time of erasing, it is set to 15V when the block A1 is selected, while it is set to 0V when the block A1 is not selected.

The decoder (BDND1) 212 sets the signal line BDN1 connected to the inversion circuit 206 to the predetermined potential in accordance with the reading, writing, and erasing operation modes.

More specifically, at the time of reading, it is set to $V_M$ when the block A1 is selected, while it is set to 0V when the block A1 is not selected.

At the time of writing, it is set to −9V when the block A1 is selected, while it is set to 0V when the block A1 is not selected.

At the time of erasing, it is set to 0V regardless of whether the block A1 is selected or not.

The p-well control circuit 213 sets the potential of the substrate p-well of the memory cell array 201 to the predetermined potential in accordance with the reading, writing, and erasing operation modes.

More specifically, it sets the same to 0V at the time of reading and writing, and sets the same to −6V at the time of erasing.

Next, an explanation will be made of the operation by the above configuration.

First, an explanation will be made by taking as an example a case where the data stored in the memory cell transistor M110 belonging to the memory cell block A1 is read.

In this case, the selection signal supply line DSG0 is set to 0V by the decoder 209, and the selection signal supply line DSG1 is set to 5V by the decoder 210. By this, the selection gates DST000 and DST001 of the memory cell block A0 are held in the nonconductive state, and the selection gates DST100 and DST101 of the memory cell block A1 are held in the conductive state.

Further, the level of the node ND1 connected to the inversion circuit 206b to which the word line WL11 selected is connected among the four output nodes of the DINOR decoder 204 is set to the negative voltage $V_M$, and the level of the remaining nodes ND0, ND2, and ND3 is set to 5V.

Then, at this time, a Vth in accordance with the threshold voltage of the recording data, that is, more specifically, a corresponding voltage among the word line voltages $V_{WL00}$, $V_{WL01}$, and $V_{WL10}$ shown in FIG. 10 is supplied to the signal line BDP1 by the decoder 211. The negative voltage $V_M$ is supplied to the signal line BDN1 by the decoder 212.

Further, the potential of p-well of the memory cell array 201 is set to 0V by the p-well control circuit 213.

At this time, the negative voltage $V_M$ is supplied to only the input of the inversion circuit 206b of the inversion circuit group 206, and 5V is supplied to the inputs of the other inversion circuits 206a, 206c, and 206d, therefore the PMOS transistor side becomes conductive in state only in the inversion circuit 206b, and the NMOS transistor side becomes conductive in state in the other inversion circuits 206a, 206c, and 206d.

As a result, the threshold voltage Vth due to the decoder 211 is supplied to the selected word line WL11 of the memory cell block A1, and the negative voltage $V_M$ due to the decoder 212 is supplied to the other word lines WL10, WL12, and WL13 in the memory cell block A1.

By this, the data stored in the memory cell M110 is read to the bit line BL0 via the selection gates DST100 and amplified at the sense amplifier 202.

Next, an explanation will be made of the case where the data is written in memory cell transistors connected to the word line WL11 in units of pages.

In this case, the selection signal supply line DSG0 is set to 0V by the decoder 209, and the selection signal supply line DSG1 is set to 8V by the decoder 210. By this, the selection gates DST000 and DST001 of the memory cell block A0 are held in the nonconductive state, and the selection gates DST100 and DST101 of the memory cell block A1 are held in the conductive state.

Further, the level of the node ND1 connected to the inversion circuit 206b to which the word line WL11 selected is connected among the four output nodes of the DINOR decoder 204 is set to 0V, and the level of the remaining nodes ND0, ND2, and ND3 is set to –9V.

Then, at this time, 0V is supplied to the signal line BDP1 by the decoder 211, and –9V is supplied to the signal line BDN1 by the decoder 212.

Further, the potential of the p-well of the memory cell array 201 is set to 0V by the p-well control circuit 213.

At this time, 0V is supplied to only the input of the inversion circuit 206b of the inversion circuit group 206, and –9V is supplied to the inputs of the other inversion circuits 206a, 206c, and 206d, therefore the NMOS transistor side becomes conductive in state only in the inversion circuit 206b, and the PMOS transistor side becomes conductive in state in the other inversion circuits 206a, 206c, and 206d.

As a result, –9V due to the decoder 212 is supplied to the selected word line WL11 of the memory cell block A1, and 0V due to the decoder 211 is supplied to the other word lines WL10, WL12, and WL13 in the memory cell block A1.

In this state, the write data propagated to the bit line is written in the memory cell transistors as the predetermined potential.

Next, an explanation will be made of the case where the data recorded in a memory cell transistor of the memory cell block A1 is erased.

In this case, the selection signal supply lines DSG0 and DSG1 are set to 0V by the decoders 209 and 210. By this, all selection gates DST000, DST001 and DST100, DST101 of the blocks A0 and A1 are held in the nonconductive state.

Further, the level of the four output nodes ND0, ND1, ND2, and ND3 of the DINOR decoder 204 is set to 0V.

Then, at this time, 15V is supplied to the signal line BDP1 by the decoder 211, and 0V is supplied to the signal line BDN1 by the decoder 212. Similarly, 0V is supplied to the signal line BDP0 by the decoder 207, and 0V is supplied to the signal line BDN0 by the decoder 208.

Further, the potential of the p-well of the memory cell array 201 is set to –6V by the p-well control circuit 213.

At this time, 0V is supplied to the inputs of the all inversion circuits 206a to 206d of the inversion circuit group 206, therefore the PMOS transistor side becomes conductive in state in the inversion circuits 206a to 206d. Further, 0V is supplied to the inputs of the all inversion circuits 205a to 205d of the inversion circuit group 205, therefore the PMOS transistor side becomes conductive in state in the inversion circuits 205a to 205d.

As a result, 15V due to the decoder 211 is supplied to the word lines WL10 to WL13 of the memory cell block A1, and 0V due to the decoder 207 is supplied to the word lines WL00 to WL03 of the memory cell block A0.

By this, the data of the memory cell block A1 is erased all together.

As explained above, according to the present embodiment, in the nonvolatile semiconductor memory device 200 having the memory array of a DINOR structure, the voltage of the non-selected word lines was set to $V_M$ at the time of reading, therefore, similar to the case of the NAND type, it becomes possible to set the threshold voltage distribution width of the memory cell transistor and the interval between one data and the next wider. As a result, the writing control becomes easier and the disturbance/retention characteristics can be enhanced.

What is claimed is:

1. A nonvolatile semiconductor memory device comprising:

a plurality of data storage memory transistors being located at cross points of a plurality of word lines and a plurality of bit lines, each said data storage memory transistor having a charge storing portion, a threshold voltage of said data storage memory transistor being changed in response to an amount of a charge stored in said charge storing portion, and each said data storage memory transistor having multi-level data states comprised of at least three levels according to the change of the threshold voltage;

a plurality of NAND strings, each said NAND string constituted by a series connection of said data storage memory transistors between a source line and said bit line;

a data programming means for changing the threshold voltage of said data storage memory transistor by applying a program word line voltage and a program bit line voltage to said data storage memory transistor in response to a programming data level selected from said multi-level data states; and a data reading means for reading out the programmed data by applying a read word line voltage and a read bit line voltage to said data storage memory transistor in response to the programed data level selected from said multi-level data states, wherein at least one read word line voltage is in a range of negative voltage and a lowermost threshold voltage distribution of a first data level and a part of a next lowest threshold voltage distribution of a second data level are in a range of negative voltage.

2. A method of reducing read disturbance of a nonvolatile semiconductor memory device, wherein said nonvolatile semiconductor memory device comprises:

a plurality of data storage memory transistors being located at cross points of a plurality of word lines and a plurality of bit lines, each said data storage memory transistor having a charge storing portion, a threshold voltage of said data storage memory transistor being changed in response to an amount of a charge stored in said charge storing portion, and each said data storage memory transistor having multi-level data states comprised of at least three levels in response to the change of the threshold voltage; and a plurality of NAND strings, each said NAND string constituted by a series connection of said data storage memory transistor between a source line and said bit line;

said method of the nonvolatile semiconductor device comprising the steps of:

a data programming step by which the threshold voltage of said data storage memory transistor is changed by applying a program word line voltage and a program bit line voltage to said data storage memory transistor in response to a programming data level selected from said multi-level data states; and a data reading step by which the programmed data is read out by applying a read word line voltage and a read bit line voltage to said data storage memory transistor in response to the programmed data level selected from said multi-level data states, wherein at least one read word line voltage is in a range of negative voltage and a lowermost threshold voltage distribution of a first data level and a part of a next lowest threshold voltage distribution of a second data level are in a range of negative voltage.

3. A nonvolatile semiconductor memory device comprising:

a plurality of data storage memory transistors being located at cross points of a plurality of word lines and a plurality of bit lines, each said data storage memory transistor having a charge storing portion, a threshold voltage of said data storage memory transistor being changed in response to an amount of a charge stored in said charge storing portion, and each said data storage memory transistor having multi-level data states comprised of at least three levels according to the change of the threshold voltage; and a NOR-type structure, said NOR-type structure constituted of each of said data storage memory transistors connected in parallel between a source line and said bit line;

a data programming means for changing the threshold voltage of said data storage memory transistor by applying a program word line voltage and a program bit line voltage to said data storage memory transistor in response to a programing data level selected from said multi-level data states; and a data reading means for reading out the programmed data by applying a read word line voltage and a read bit line voltage to said data storage memory transistor in response to the programmed data level selected from said multi-level data states, wherein at least one read word line voltage is in a range of negative voltage and part of a lowermost threshold voltage distribution of a first data level is in a range of negative voltage.

4. A method of reducing read disturbance of a nonvolatile semiconductor memory device, wherein said nonvolatile semiconductor memory device comprises:

a plurality of data storage memory transistors being located at across points of a plurality of word lines and a plurality of bit lines, each said data storage memory transistor having a charge storing portion, a threshold voltage of said data storage memory transistor being changed in response to an amount of a charge stored in said charge storing portion, and each said data storage memory transistor having multi-level data states comprised of at least three levels in response to the change of the threshold voltage; and a NOR-type structure, said NOR-type structure constituted of each of said data storage memory transistors connected in parallel between a source line and said bit line;

said method of the nonvolatile semiconductor device comprising the steps of:

a data programming step by which the threshold voltage of said data storage memory transistor is changed by applying a program word line voltage and a program bit line voltage to said data storage memory transistor in response to a programming data level selected from said multi-level data states; and a data reading step by which the programmed data is read out by applying a read word line voltage and a read bit line voltage to said data storage memory transistor in response to the programed data level selected from said multi-level data states, wherein at least one read word line voltage is in a range of negative voltage and part of a lowermost threshold voltage distribution of a first data level is in a range of negative voltage.

* * * * *